United States Patent [19]
Kim et al.

[11] Patent Number: 6,093,653
[45] Date of Patent: Jul. 25, 2000

[54] GAS MIXTURE FOR ETCHING A POLYSILICON ELECTRODE LAYER AND ETCHING METHOD USING THE SAME

[75] Inventors: Dong-yun Kim, Suwon; Kyoung-hwan Yeo, Yongin, both of Rep. of Korea

[73] Assignee: Samsung Electronics Co., Ltd., Suwon, Rep. of Korea

[21] Appl. No.: 09/114,520

[22] Filed: Jul. 13, 1998

[30] Foreign Application Priority Data

Jul. 16, 1997 [KR] Rep. of Korea ........................ 97-33247

[51] Int. Cl.$^7$ ................................................. H01L 21/3065
[52] U.S. Cl. .......................... 438/706; 720/742; 252/79.1
[58] Field of Search ................................. 438/738, 742, 438/706, 720; 252/79.1

[56] References Cited

U.S. PATENT DOCUMENTS

| | | | |
|---|---|---|---|
| 4,818,334 | 4/1989 | Shwartzman et al. | 438/714 |
| 5,145,797 | 9/1992 | Nakanishi | 438/265 |
| 5,529,197 | 6/1996 | Grewal | 438/585 |
| 5,582,679 | 12/1996 | Lianjun et al. | 438/669 |
| 5,772,833 | 6/1998 | Inazawa et al. | 156/345 |
| 5,795,829 | 8/1998 | Shen | 438/694 |

*Primary Examiner*—Benjamin L. Utech
*Assistant Examiner*—Lynette T. Umez-Eronini
*Attorney, Agent, or Firm*—Jones Volentine, LLP

[57] ABSTRACT

A gas mixture for etching a polysilicon electrode layer in a plasma etching apparatus, and a method for etching the electrode layer using the same. The etching gas mixture is a mixture of $Cl_2$ gas and $N_2$ gas, wherein the $N_2$ gas is in the range of about 30% by volume of the total volume of $Cl_2$ gas and $N_2$ gas combined. In the electrode layer etching method of the present invention, the polysilicon electrode layer is formed on a semiconductor substrate. A mask pattern of an oxide or photoresist is then formed on the electrode layer. The electrode layer is etched using a plasma formed by the gas mixture of $Cl_2$ gas and $N_2$ gas, with the mask pattern functioning as an etching mask. An upper power source of the plasma etching apparatus delivers power in the range of about 500 to 1000 W, while the etching gas mixture is formed by supplying $Cl_2$ gas at a rate of about 100 to 400 sccm, and $N_2$ gas at a rate of about 3 to 15 sccm.

11 Claims, 1 Drawing Sheet

GAS MIXTURE FOR ETCHING A POLYSILICON ELECTRODE LAYER AND ETCHING METHOD USING THE SAME

BACKGROUND OF THE INVENTION

1. Field of the Invention

The present invention relates to a micro pattern forming method for a semiconductor device, and more particularly, to a gas mixture used in etching an electrode layer made of polysilicon, and to an etching method using the gas mixture.

2. Description of the Related Art

Polysilicon is generally used as the conductive material of choice for forming a lower electrode of a capacitor during the process of manufacturing a semiconductor device. In order to form an electrode, a layer of polysilicon is first deposited on the semiconductor substrate. A mask pattern is then formed over the polysilicon layer. Finally, the polysilicon layer is etched using the mask pattern as an etching mask.

To pattern the polysilicon electrode layer, etching methods using a plasma are typically employed. An etching apparatus employing TCP (Transformer Coupled Plasma) technology can form a sufficiently uniform plasma by creating an electromagnetic field using a coil shaped conductor or similar structure. The TCP etching method anisotropically etches the polysilicon electrode layer by directly controlling an ion density or an upper power source, to obtain selectivity of the etching gas for oxide and photoresist materials.

Conventionally, when forming an electrode layer made of polysilicon, a gas mixture containing mostly hydrogen bromide (HBr) is used as an etching gas. The HBr gas has a strong tendency to etch the polysilicon electrode layer vertically, which protects the side walls of the etched layer during the etching process. HBr is also highly selective for etching the oxide layer used as the mask layer. One disadvantage of using HBr gas in the etching gas mixture, however, is that it results in a low etch rate which makes the etching process less reproducible and results in inferior products. HBr gas also results in the overproduction of unwanted byproducts, such as polymers, which generate contamination and create a need for frequent regular cleaning of the etching apparatus.

Therefore, a need exists for an etching gas mixture that can efficiently etch a polysilicon electrode layer without generating unwanted, contaminating byproducts. The etching gas mixture and the method of etching an electrode layer of the present invention reduce etching time, reduce contaminating byproducts and enhance reproducibility.

SUMMARY OF THE INVENTION

An object of the present invention is to provide an etching gas mixture which can efficiently etch a polysilicon electrode layer.

It is another object of the present invention to provide a method for efficiently etching a polysilicon electrode layer by employing a dry etching method using a plasma made from a navel gas mixture.

To accomplish these and other advantages, the gas mixture for etching a polysilicon layer according to the present invention is made of $Cl_2$ gas and $N_2$ gas. The maximum amount of $N_2$ gas in the mixture is about 30% by volume and the minimum amount of $N_2$ gas in the mixture is about 3% by volume of the total $N_2$ and $Cl_2$ gas mixture.

In the etching method according to the present invention, the polysilicon electrode layer, comprising a conductive material, is formed on a semiconductor substrate, a mask pattern is then formed on the electrode layer using photolithography. The electrode layer having a mask pattern formed thereon, is then etched using a plasma formed of an etching gas mixture of $Cl_2$ gas and $N_2$ gas. The mask pattern functions as an etching mask.

In a preferred embodiment, the electrode layer is formed of polysilicon. The electrode layer etching step is performed with the plasma etching apparatus adjusted so that an upper power source supplies power in the range of from about 500 W to about 1000 W. To form the etching gas mixture, $Cl_2$ gas is supplied to the chamber of the plasma etching apparatus at a rate of from about 100 to about 400 sccm (Standard Cubic Centimeter), and $N_2$ gas is supplied at a rate of from about 3 to about 15 sccm.

In yet another preferred embodiment, the present invention is directed to an etching method wherein the etching step is performed in a chamber of a plasma etching apparatus maintained under a pressure of from about 15 to 25 mTorr.

An advantage of the present invention is that the etching process is shortened, thereby improving the reproducibility of the etching process and reducing the amount of contamination caused by the overproduction of unwanted polymer byproducts. Thus, the frequency of regular cleaning required to maintain the chamber of the etching apparatus in operating order is greatly reduced.

BRIEF DESCRIPTION OF THE DRAWINGS

The accompanying drawings illustrate embodiments of the invention in which.

DETAILED DESCRIPTION OF THE PREFERRED EMBODIMENTS

A method for etching an electrode layer of a semiconductor device and a gas mixture to be used for etching an electrode layer will hereinafter be described in detail with reference to FIG. 1 and FIG. 2.

In general, the selection of a particular etching gas mixture, to be used in plasma etching of the polysilicon electrode layer using, for example, a TCP etching method, largely determines the resulting etch rate.

To form an electrode on a semiconductor substrate, an electrode layer is first formed on the semiconductor substrate using a conductive material such as polysilicon. A mask pattern, e.g., an oxide layer pattern or photoresist pattern, is then formed on top of the electrode layer. The electrode layer is then plasma etched using the mask pattern as an etching mask. In the present invention, a mixture of $Cl_2$ and $N_2$ gases is used as an etching gas mixture to etch the polysilicon electrode layer. The $N_2$ gas is used to enhance anisotropic etching characteristics by generating a polymer during the etching process that protects the side walls of the etched electrode layer.

For anisotropic etching of an electrode layer made of polysilicon, the amount of $N_2$ gas should preferably not exceed 30% by volume of the total combined volume of $Cl_2$ gas and $N_2$ gas in order to avoid producing unwanted byproducts which can occur when the $N_2$ gas level is too high.

In a preferred embodiment, $Cl_2$ gas is introduced into the etching chamber at a rate of from about 100 to about 400 sccm; while $N_2$ gas is introduced at a rate of from about 3 to 15 sccm.

Figure 1:
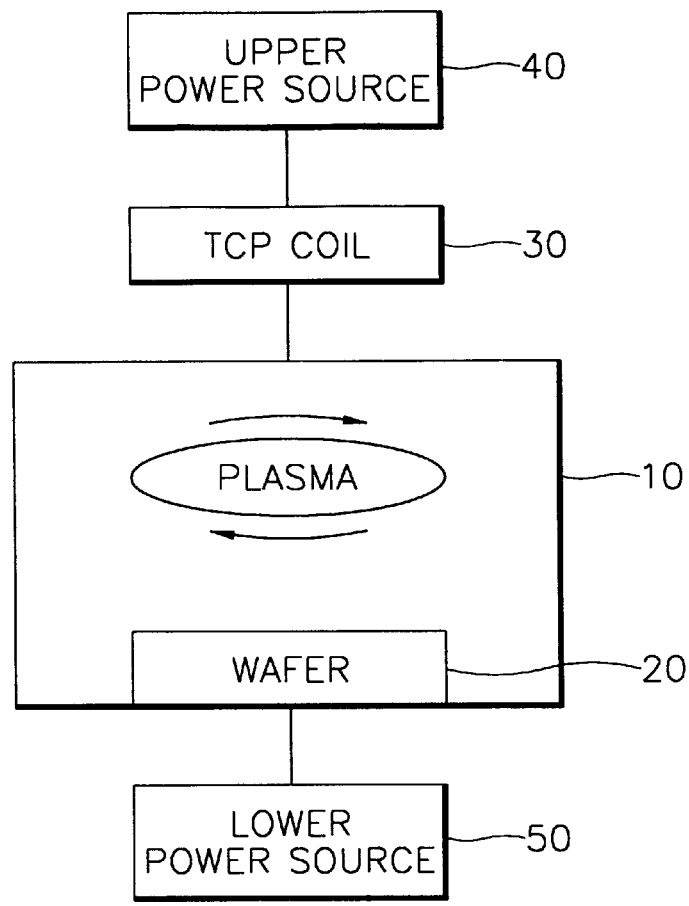
FIG. 1 is a schematic block diagram of a TCP (Transformed Coupled Plasma) etching apparatus.

FIG. 1 is a schematic block diagram of a TCP etching apparatus. The TCP etching apparatus includes an upper power source 40 for supplying power to TCP coil 30 that is installed over a wafer 20 within a chamber 10. The wafer 20 contains an electrode layer (not shown) deposited thereon, which electrode layer is to be etched. The apparatus also has a lower power source 50 for supplying power from the lower side of a stage (not shown) onto which the wafer 20 is loaded. The upper power source 40 serves to activate the etching gas which forms a plasma, and the lower power source 50 serves to draw the activated gas toward the wafer 20.

Table 1 shows the effects of varying the amount of energy, measured in Watts (W), and supplied from the upper power source 40, on various parameters that were measured during the etching process of a polysilicon electrode layer deposited on a wafer substrate. The electrode layer was coated with a photoresist mask layer. The results show that increasing the upper power from 400 to 800 W, while holding other parameters constant, causes a significant increase in the etch rate (Å/min) of the polysilicon electrode layer using the above-described TCP etching apparatus.

The conditions of the TCP etching apparatus were set such that the pressure in the chamber was 20 mTorr, the lower power was 90 W, the flow rate of $Cl_2$ was 150 sccm, the flow rate of $N_2$ was 7 sccm, and the pressure of a helium (He) gas supplied to backside of the wafer was 8 Torr. A flow rate of $Cl_2$ of 150 sccm and a flow rate of $N_2$ of 7 sccm, results in an etching gas mixture where the amount of $N_2$ gas is about 5% by volume of the total combined volume of $Cl_2$ gas and $N_2$ gas. The amount of energy supplied by the upper power source was increased from 400 W to 800 W in increments of 100 W, while all other parameters remained constant.

TABLE 1

Etch Rates of a Polysilicon Layer as a Function of Power Supplied

| Upper Power (W) | Etch Rate (Å/min) | Uniformity (%) | Selectivity To Photoresist Layer | Mouse Bite Defect | Profile | CD Skew |
|---|---|---|---|---|---|---|
| 400 | 3520 | 4.5 | 1.12 | Severe | Normal | 0.16 |
| 500 | 3600 | 3.2 | 1.20 | Weak | Normal | 0.18 |
| 600 | 4200 | 4.0 | 1.32 | None | Normal | 0.18 |
| 700 | 4800 | 4.9 | 1.42 | None | Normal | 0.18 |
| 800 | 5300 | 5.2 | 1.5 | None | Normal | 0.18 |

The results displayed in Table 1 show that there is a significant increase in the etch rate of the polysilicon electrode layer as the upper power increases from 400 to 800 W, with the other conditions maintained at a constant level. Regarding the other parameters, note that the Uniformity remained generally constant, as did the Profile and CD Skew. However, the Mouse Bite Defect changed from "severe" to "weak" to "none". Mouse Bite Defect is a defect in the edge portion of the patterned polysilicon layer. A mouse bite defect is produced by dry etching an edge portion of the polysilicon layer that was accidentally unprotected or unmasked when a part of the photoresist layer breaks away from the edge at the border of the polysilicon layer. The mouse bite defect leaves a sharp-pointed etched area in the polysilicon layer where electric charges can be preserved, thereby causing a leakage of current in the device.

Selectivity to Photoresist Layer in Table 1 refers to the etching selectivity of the polysilicon layer compared to the photoresist layer. This is measured as a ratio of the amount of the polysilicon layer that is etched to the amount of the photoresist layer that is etched.

CD Skew in Table 1 refers to the difference between the critical dimensions ADI (after development inspection) and ACI (after cleaning inspection). Generally, the critical dimension of the line or space of a photoresist mask pattern that is inspected after development of the photoresist (ADI) differs from the critical dimension of the same line or space that is formed after the layer is dry etched using the photoresist mask and the photoresist has been stripped off (ACI). For an upper power of 400W, the DC skew is 0.16 which means that the critical dimension of the space between lines formed by the photoresist layer (ADI) is 0.16 microns greater than that of the pattern formed after dry etching using the photoresist as a mask (ACI).

In a preferred embodiment according to the present invention, the upper power is in the range of from about 500 to about 1000 W. In a more preferred embodiment, the upper power is adjusted to between about 700 W and 1000 W, which improves the etch rate of the polysilicon layer by accelerating ionization of $Cl_2$.

Figure 2:
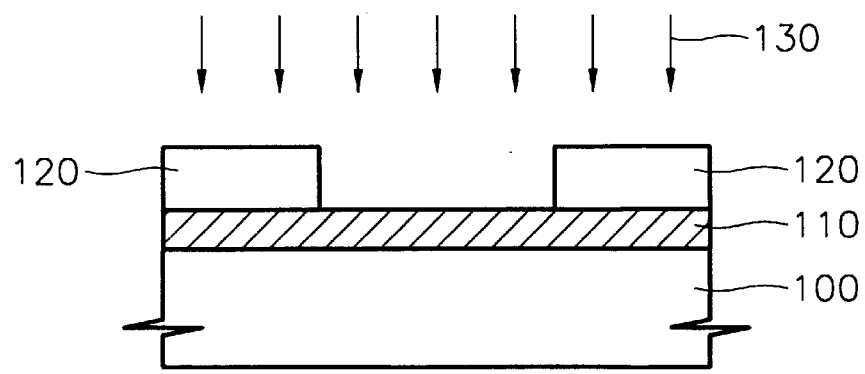
FIG. 2 is a sectional view of a wafer having a polysilicon electrode layer on its surface and a mask pattern on the electrode layer, with the arrows representing the plasma etching gas mixture.

FIG. 2 is a wafer cross section illustrating the etching method of the present invention. As shown in FIG. 2, an electrode layer 110, e.g., a doped polysilicon layer, is formed on a semiconductor substrate 100, and a mask pattern 120, e.g., an oxide layer pattern, is formed on the electrode layer 110. The arrows in FIG. 2 represent the plasma etching gas mixture 130.

The electrode layer 110 is etched in the TCP etching apparatus by using a plasma 130 formed by a gas mixture of $Cl_2$ gas and $N_2$ gas as described above. The mask pattern 120 serves as an etching mask. In a preferred embodiment, a gas mixture of from about 100 to 400 sccm of $Cl_2$ gas and from about 3 to 15 sccm of $N_2$ gas is supplied to the TCP etching apparatus. The amount of $N_2$ gas in the gas mixture is about 3–30% by volume of the total combined volume of $Cl_2$ gas and $N_2$ gas. The upper power of the TCP etching apparatus is adjusted to be in the range of from about 500 W to about 1000 W.

The range of the pressure in the chamber, suitable for etching a polysilicon electrode layer in the present etching method, is from about 15 mTorr to about 25 mTorr, preferably, about 20 mTorr. The lower power is in the range of from about 70 W to about 200 W, with a preferred embodiment having a lower power of about 100W.

In a first example, a polysilicon electrode layer having a thickness of 7000 Å was etched using the etching method of the present invention. The etching conditions were as follows: 20 mTorr pressure in the etching chamber, 700 W for the upper power, 100 W for the lower power, 200 sccm and 10 sccm flow rates of $Cl_2$ gas and $N_2$ gas, respectively, as the etching gas mixture. The amount of $N_2$ gas in this mixture is about 5% volume of the total combined volume of the two gases. Under these conditions, the processing time per wafer was 135 seconds. This corresponds to an etch rate of 3,111 Å per minute.

By contrast, in a second example, when a polysilicon layer of the same 7,000 Å thickness was etched using a 10 mT chamber pressure, 300 W upper power, and HBr gas, with conditions that were otherwise identical with those set forth above, a processing time of 264 sec/wafer was obtained. This corresponds to a much lower etching rate of 1,591 Å per minute.

These results show that the processing time can be shortened considerably by increasing the etching rate which is accomplished by preferably increasing the upper power to 700 W and using a mixture of $Cl_2$ gas and $N_2$ gas, wherein the amount of $N_2$ gas is about 30% by volume of the total combined volume of the two gases. By using a $Cl_2$ gas and $N_2$ gas mixture, and by increasing the upper power to about 700 W, the processing time is shortened and the reproducibility of the process is increased.

Under the conditions set forth in the above examples, the selectivity of the etching gas mixture for the oxide layer or photoresist layer used as the mask layer was tested using HBr as the etching gas, and tested using the mixture of $Cl_2$ and $N_2$ gases of the present invention as the etching gas. When HBr was used as the etching gas, the selectivity of the etching gas to the oxide layer was 6.0, and the selectivity to the photoresist was 1.1. However, when the etching gas mixture of $Cl_2$ and $N_2$ gases of the present invention was used, the etching selectivity to the oxide layer and the photoresist layer were 9.0 and 1.4, respectively. This represents a significant improvement in selectivity when the etching gas mixture of the present invention is used.

It was also discovered that when the etching gas mixture of $Cl_2$ and $N_2$ gases of the present invention was used, regular cleaning of the etching apparatus was only required once every 10,000 minutes. This represents a 290% improvement over the conventional case where HBr is used as an etching gas, where cleaning is required much more frequently, namely, on the order of once every 3,500 minutes.

Although the description of the present invention and the examples set forth above use a plasma etching apparatus in which the upper power source and the lower power source are simultaneously and independently controlled, the invention is not limited to this type of etching apparatus. The claimed gas mixture and method for etching an electrode layer are also applicable to a plasma etching apparatus in which a single upper power source is employed.

The process of etching a polysilicon electrode layer according to the present invention is shortened when an etching gas mixture of $Cl_2$ and $N_2$ gas is used, wherein the $N_2$ gas is in the range of from about 30% by volume of the total volume of $Cl_2$ gas and $N_2$ gas combined, and the upper power is adjusted to a range of from about 500 W to about 1000 W. The etching gas mixture of $Cl_2$ and $N_2$ gases results in the production of less unwanted byproducts which could generate contamination in the process chamber, and thereby reduces the frequency of required cleaning intervals of the etching apparatus.

The present invention is not limited to the embodiments set forth above, and it is clearly understood that many variations may be made within the scope of the present invention by anyone skilled in the art.

What is claimed is:

1. A method for etching an electrode layer of a semiconductor device comprising the steps of:

forming the electrode layer on a semiconductor substrate using a conductive material;

forming a mask pattern on the electrode layer to create an etching mask; and etching the electrode layer in a plasma etching chamber by supplying a gas mixture of $Cl_2$ gas and $N_2$ gas into the reaction chamber, wherein the $N_2$ gas is in the range of about 30% by volume of the total volume of the $Cl_2$ gas and $N_2$ gas combined, and delivering power in the range of from 700 W to 1000 W to a coil provided in an upper part of the etching chamber to ionize the $Cl_2$ and thereby form plasma used to etch the electrode layer.

2. The method according to claim 1, wherein the electrode layer comprises polysilicon.

3. The method according to claim 2, wherein the electrode layer forms a lower electrode of a capacitor.

4. The method according to claim 1, wherein the mask pattern is an oxide layer.

5. The method according to claim 1, wherein the mask pattern is a photoresist layer.

6. The method according to claim 1, wherein the etching step comprises supplying the $Cl_2$ gas into the plasma etching chamber at a rate of from about 100 to 400 sccm, and supplying the $N_2$ gas into the etching chamber at a rate of from about 3 to 15 sccm.

7. The method according to claim 1, wherein the etching is performed by also delivering power to a lower portion of the etching chamber below the semiconductor substrate in order to draw the ionized gas toward the substrate.

8. The method according to claim 7, wherein the etching is performed using a Transformer Coupled Plasma etching apparatus.

9. The method according to claim 1, wherein the etching is performed using only a single electrode.

10. The method according to claim 7, wherein the etching is performed by delivering power in the range of from about 70 W to about 200 W to the lower portion of the etching chamber.

11. The method according to claim 10, wherein the etching step also comprises maintaining a pressure in the plasma etching chamber of from about 15 mTorr to about 25 mTorr.

* * * * *